United States Patent [19]

Kinoshita et al.

[11] Patent Number: 4,586,251
[45] Date of Patent: May 6, 1986

[54] APPARATUS FOR MOUNTING ELECTRIC PARTS

[75] Inventors: Hiromi Kinoshita, Katano; Kouji Fujiwara, Yamato Kouriyama; Yoshinobu Maeda, Katano, all of Japan

[73] Assignee: Matsushita Electric Industrial Co., Ltd., Osaka, Japan

[21] Appl. No.: 713,581
[22] PCT Filed: May 28, 1982
[86] PCT No.: PCT/JP82/00207
    § 371 Date: Feb. 1, 1983
    § 102(e) Date: Feb. 1, 1983
[87] PCT Pub. No.: WO82/04374
    PCT Pub. Date: Dec. 9, 1982

Related U.S. Application Data

[63] Continuation of Ser. No. 468,799, Feb. 1, 1983, abandoned.

[30] Foreign Application Priority Data

Jun. 1, 1981 [JP] Japan .................................. 56-84690

[51] Int. Cl.[4] .............................................. H05K 3/30
[52] U.S. Cl. ........................................ 29/741; 29/759
[58] Field of Search ................ 29/564.1, 566, 3, 741, 29/739, 837–839

[56] References Cited

U.S. PATENT DOCUMENTS

| | | | |
|---|---|---|---|
| 4,070,753 | 1/1978 | Lin | 29/741 |
| 4,149,311 | 4/1979 | Benson et al. | 29/741 |
| 4,293,988 | 10/1981 | Kawa et al. | 29/741 X |

Primary Examiner—Carl E. Hall
Attorney, Agent, or Firm—Wenderoth, Lind & Ponack

[57] ABSTRACT

An apparatus for mounting electric parts on a printed circuit board, wherein the printed circuit board is transferred and is positioned and fixed at a predetermined position, includes a part mounting head for inserting 1 part into the printed circuit board and an anvil for bending the legs of the part inserted into the printed circuit board. The head and anvil are moved as a unit in a horizontal plane and they are movable between an independent separate supply section and the predetermined position for the printed circuit board.

5 Claims, 18 Drawing Figures

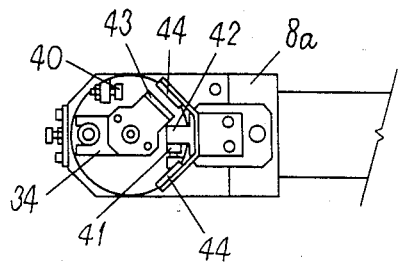
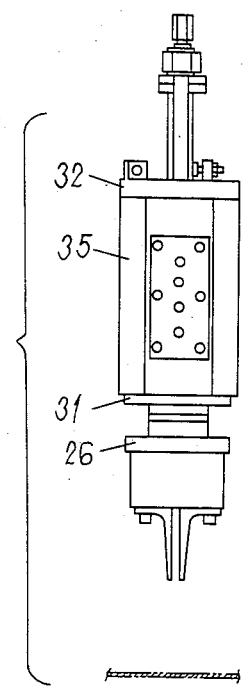
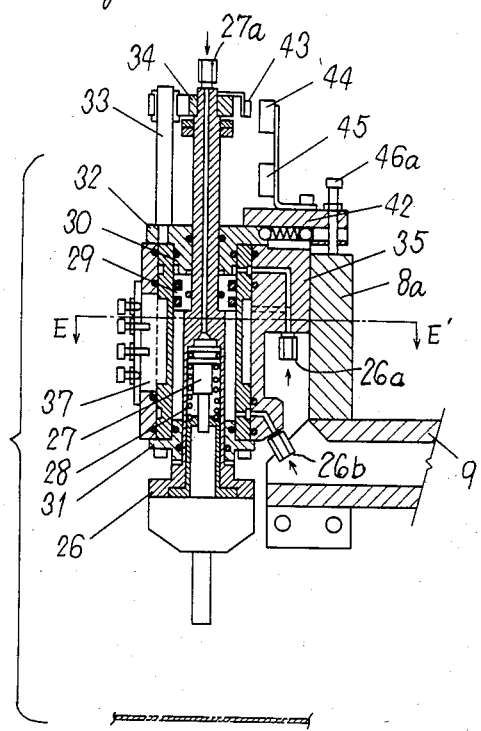

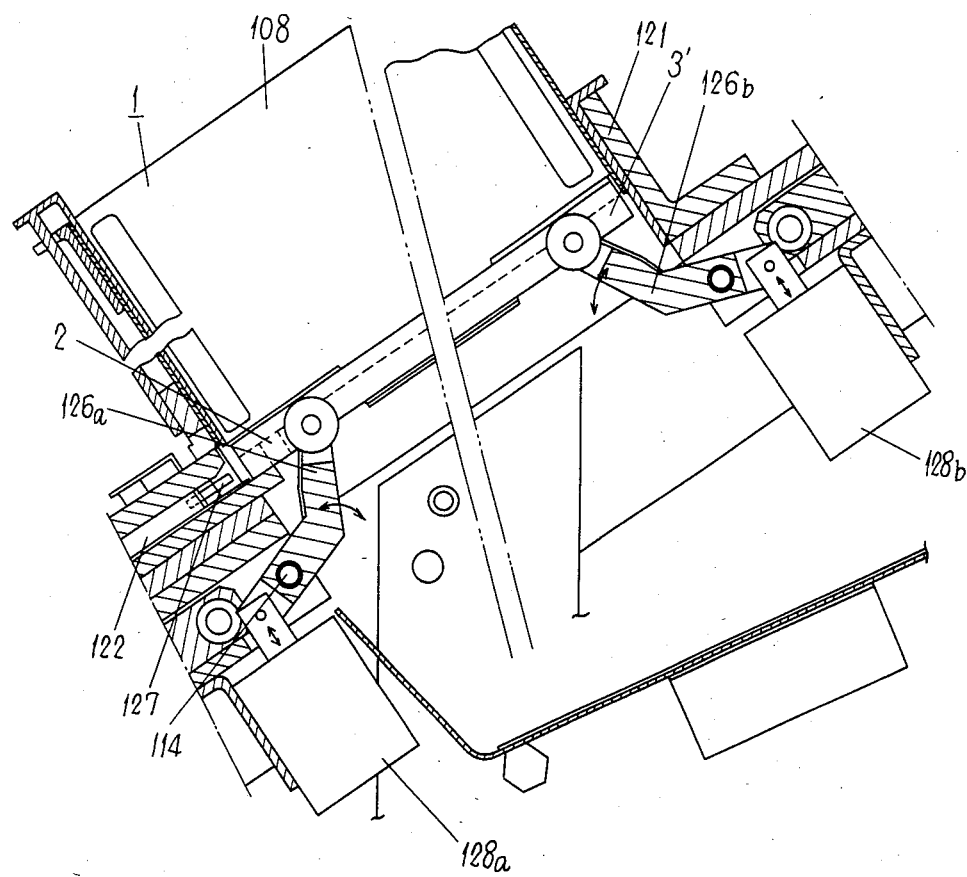

APPARATUS FOR MOUNTING ELECTRIC PARTS

This application is a continuation of now abandoned Ser. No. 468,799, filed Feb. 1, 1983, now abandoned.

TECHNICAL FIELD

The present invention relates to an apparatus for withdrawing electric parts, such as resistors, capacitors, IFTs, ICs, and semi-fixed volumes, from a predetermined supply position and mounting them on a fixed printed circuit board at predetermined positions.

BACKGROUND ART

A conventional electric part mounting apparatus of this type, as shown in FIG. 1, comprises a printed circuit board transfer section 202 for transferring a printed circuit board 201 in horizontal condition in a fixed direction, a positioning device for locating said printed circuit board 201 at a predetermined position, a head main body 203 positioned above the printed circuit board 201 standing by at said predetermined position for mounting electronic parts on said printed circuit board 201, and an X-Y table 204 supporting said head main body 203 thereon and adapted to position said head main body at an optional position in two X and Y directions, said head main body 203 comprising a magazine holder for holding a row of magazines 205 with their part take-out ports directed downward, each magazine holding a row of the same kind of electronic parts, a part supply section 206 substantially horizontally positioned adjacent the part take-out ports of the magazines for transferring electronic parts taken out of the magazines to a predetermined position, means controlled to arrange electronic parts on said part supply section 206 in a predetermined order and adapted to deliver the electronic parts in said magazines 205 onto the part supply section 206, and an insertion head 207 for gripping electronic parts transferred by said part supply section 206 and standing by at said predetermined position and for inserting them into predetermined holes in said printed circuit board 201. Thus, the part supply section 206 and insertion head 207 are placed on the X-Y table 204 and moved in a horizontal plane, and the printed circuit board 201 is maintained in fixed condition during insertion of parts.

The arrangement described above has the following drawbacks.

(1) Since the arrangement of the insertion head is not suitable for lightweight construction, the total weight on the X-Y table is so large as to decrease the speed of movement of the X-Y table and the part mounting speed and require a large-sized drive unit.

(2) Since there are restrictions on the weight and size that can be moved by the X-Y table, parts that can be mounted at a single supply of parts are limited in number and type.

SUMMARY OF THE INVENTION

The invention provides an electric part mounting apparatus, intended to eliminate the aforesaid drawbacks, wherein with respect to a positioned printed circuit board a part supply section is disposed on one side and on the other side there is employed a part mounting section of simple and lightweight construction composed mainly of a horizontally slidable frame, thereby making it possible to mount parts at high speed using a relatively small-sized drive unit, to supply parts even during operation of the apparatus, and to perform continuous mounting of large numbers of parts.

BRIEF DESCRIPTION OF THE DRAWINGS

FIG. 6 is a plan view of a part mounting head;

FIG. 7 is a front view of the same;

FIG. 8 is a vertical section of the same;

FIG. 9 is a section taken along the line E—E' of FIG. 8;

FIGS. 10(A) and 10(B) are perspective views showing the directions in which an electric part may be mounted on a printed circuit board;

FIG. 16 is a section showing an embodiment of a part supply section.

BEST MODE FOR CARRYING OUT THE INVENTION

Figure 1:
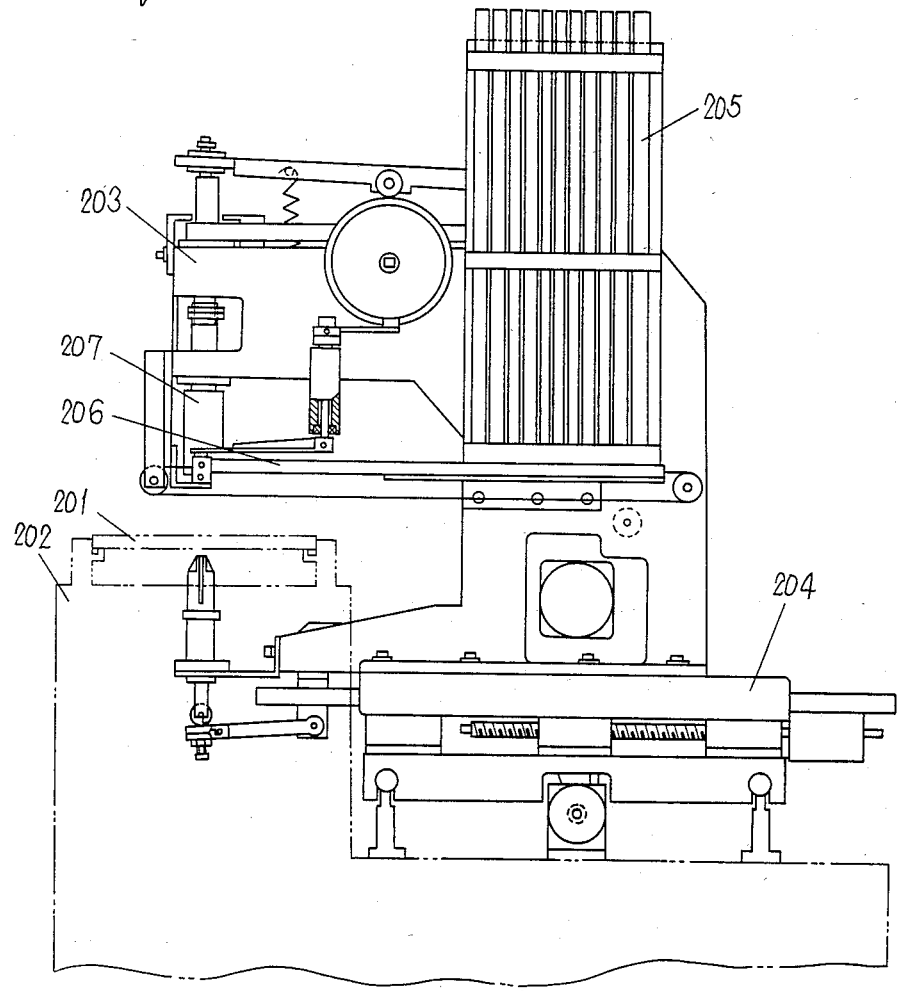
FIG. 1 is a side view of the principal portion of a conventional electric part mounting apparatus.
Figure 2:
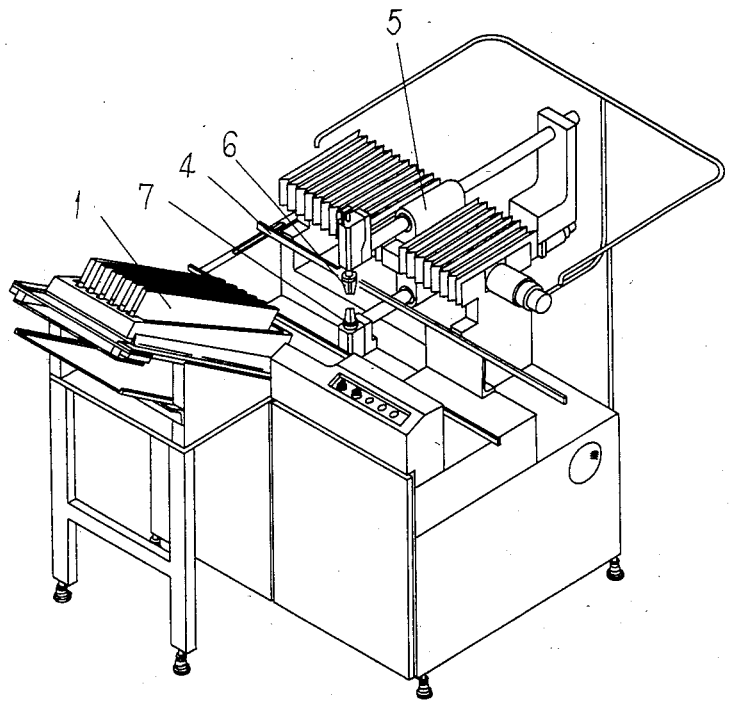
FIG. 2(A) is a perspective view of an electric part mounting apparatus, showing an embodiment of the present invention.
FIG. 2(B) is a perspective view of a magazine for storing electric parts.
Figure 2:
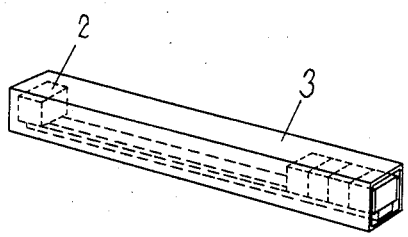

An embodiment of the present invention will now be described with reference to FIGS. 2 through 16. The numeral 1 denotes a part supply section where magazines 3 containing electric parts 2 are arranged in rows and columns, said electric parts 2 being supplied one by one from each column to a predetermined position. The numeral 4 denotes a printed circuit board transfer section for transferring a printed circuit board and positioning it at a predetermined position. The numeral 5 denotes a part insertion section constituting a part mounting section and horizontally slidably installed at a position opposed to the part supply section 1 with respect to the printed circuit board transfer section 4. The part insertion section 5 comprises a chuck section 6 disposed in the upper region for gripping an electric part 2 and an anvil section 7 disposed in the lower region for mounting an electric part 2, with a printed circuit board interposed therebetween. Section 5 moves to a predetermined position at said part supply section 1, grips an electric part 2 and moves to the insertion position for a printed circuit board, where it inserts and mounts the electric part.

Figure 3:
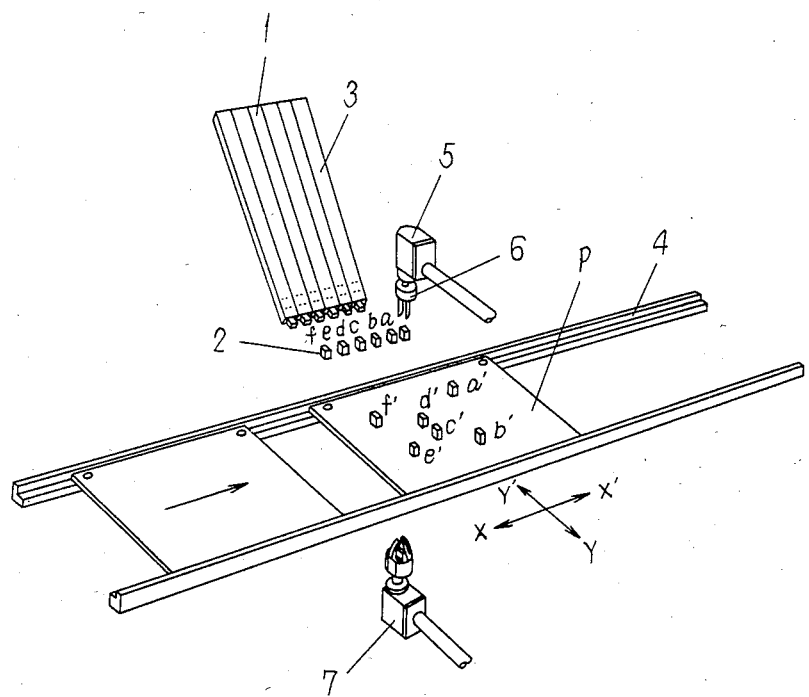
FIG. 3 is a schematic perspective view for explanation of the operation of said apparatus.

As shown in FIG. 3, section 5 transfers parts 2a, b . . . f, fed from the part supply section 1, one by one to predetermined positions a', b' . . . f' on a printed circuit board P positioned at a predetermined position and mounts them thereon.

The chuck section 6 in the part insertion section 5 has three functions, i.e., chucking or gripping of parts, vertical movement, and 90° horizontal rotation, and is attached to an end of an assembly having the function of freely moving in the X—X' and Y—Y' directions. At the same time as a part is inserted into a printed circuit board, it is inspected for the possession of legs and such legs are then bent.

The anvil section 7, like the chuck section 6, is attached to the assembly having the function of freely moving in the X—X' and Y—Y' directions. As for the part mounting operation, the chuck section 6 and the anvil section 7 cooperate with each other and start from an origin or original position (not shown) and move in the route a→a'→b→b'→c→c'... f→f'→ origin, so as to mount the parts successively.

The orientation in which parts are mounted is made at random by control and, as shown in FIGS. 10A and 10(B), two directions, X and Y, are indicated.

The devices in the respective sections which perform these movements will now be described.

Figure 4:
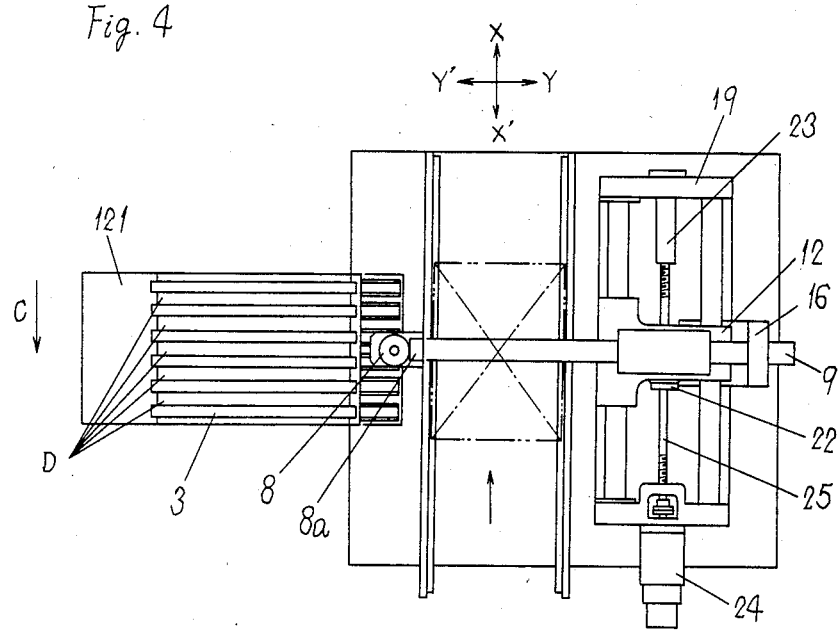
FIG. 4 is a plan view showing an embodiment of the same according to the invention.
Figure 5:
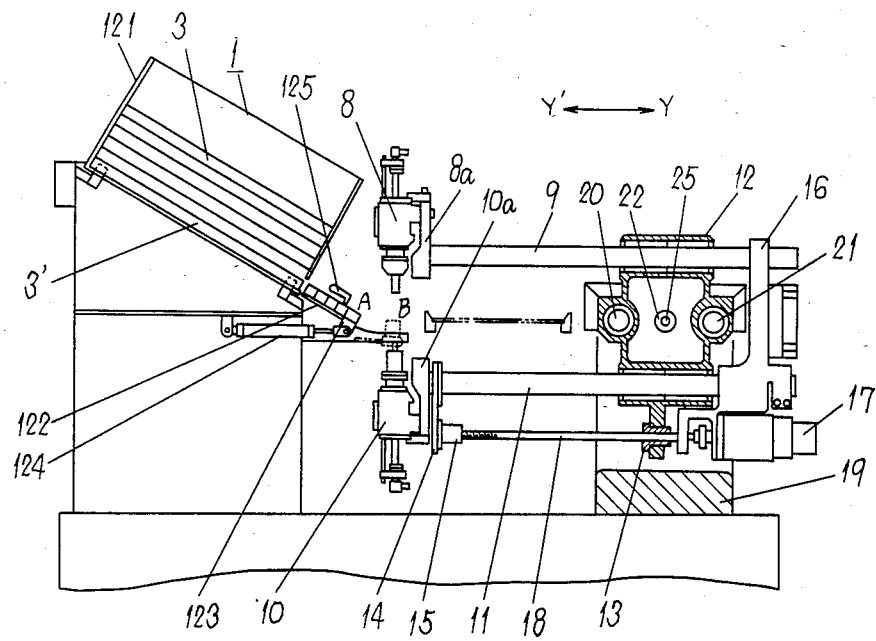
FIG. 5 is a vertical section of the same.

FIGS. 4 and 5 show the entire apparatus and wherein 8 denotes a part mounting head of chuck section 6 and which is attached to an upper guide shaft 9 through a bracket 8a. An anvil head 10 an anvil section 7 is attached to a lower guide shaft 11 through a bracket 10a. The two upper and lower guide shafts are slidably supported by a frame 2 and integrated. The upper and lower guide shafts 9 and 11 are integrally connected by a connecting frame 16 and are slidable in frame 12 in the Y—Y' directions.

Movement in the Y—Y' directions is effected by rotating a ball screw 18 engaging a nut 13 fixed to the lower portion of the frame 12. The ball screw 18 is rotatably supported at one end thereof by a bracket 14 fixed to the guide shaft 11 and is connected at the other end thereof to a motor 17 attached to the lower end of the connecting frame 16, so that the ball screw is rotated in opposite directions by the motor 17.

The frame 12 is supported so that it is slidable in the X—X' directions by two horizontal guide shafts 20 and 21 fixed to a bed 19. Movement in the X—X' directions is effected by rotating a ball screw 25 engaging a nut 22 fixed to the central portion of the frame 12. The ball screw 25 is rotatably held at one end thereof by a bearing 23 fixed to the bed 19 and is connected at the other end thereof to a motor 24 attached to the bed 19, so that the ball screw is rotated in opposite directions by the motor 24. Thus, the part mounting head 8 and anvil 10 can be moved as desired in the X—X' and Y—Y' directions in FIG. 4 by controlling the motors 17 and 24.

The construction of the part mounting head 8 will now be described with reference to FIGS. 6, 7, 8 and 9.

A piston 27 is disposed in a shaft 26 and is vertically movable downwardly therein by air under pressure, e.g. at 27a, and is urged vertically upwardly therein by a spring 28. The shaft 26 is fixed to a piston 29 and is received in a cylinder tube 30 and is adapted to be vertically movable therein by switching of upward and downward pressure feed, e.g. at 26a and 26b. The cylinder tube 30 is integrally connected at its lower side to a housing 31 and at its upper side to a housing 32, together forming a cylinder. Further, the shaft 26 and cylinder tube 30 are prevented from rotating with respect to each other by a shaft 33 fixed to housing 32 and fitted in a left-hand side notch in a guide block 34 which is fixed to the top end of the shaft 26.

The cylinder tube 30 is mounted in a head block 35, with upper and lower portions contacting the latter, and is vertically held by flange portions of the housings 31 and 32.

The cylinder tube 30 has at a mid-length portion thereof a valve portion 36 contacting the inner surface of the head block 35, as shown in FIG. 9, the remaining portion of tube 30 being somewhat smaller in diameter. A block 37 attached to the head block 35 contacts tube 30 along the length thereof in the direction of thrust. Air is fed alternately through air holes 38 and 39 formed in the head block 35 so as to make it possible to rotate the cylinder tube 30 together with the shaft 26 through 90° in opposite directions to provide for two-direction insertion (as shown in FIG. 10). To ensure 90° rotation, the housing 32 is provided with movable stops 40 and 41 adjusted in advance so that they are 90° apart. A fixed stop 42 is secured to the head block 35, so that positional accuracy is obtained by abutting between the stops 40 and 42 and between the stops 41 and 42. The numerals 43, 44 and 45 denote electrical switches to obtain signals of respective operative positions.

In addition, the head block 35 is fixed to bracket 8a, which is fixed to the shaft 9, so that block 35 is vertically adjustable by an adjusting bolt 46a.

As described above, the part mounting head 8 has three functions, i.e., the vertical movement and rotation of the shaft 26 and the vertical movement of the piston 27 within the shaft 26; this is intended for reduction of size.

Figure 11:
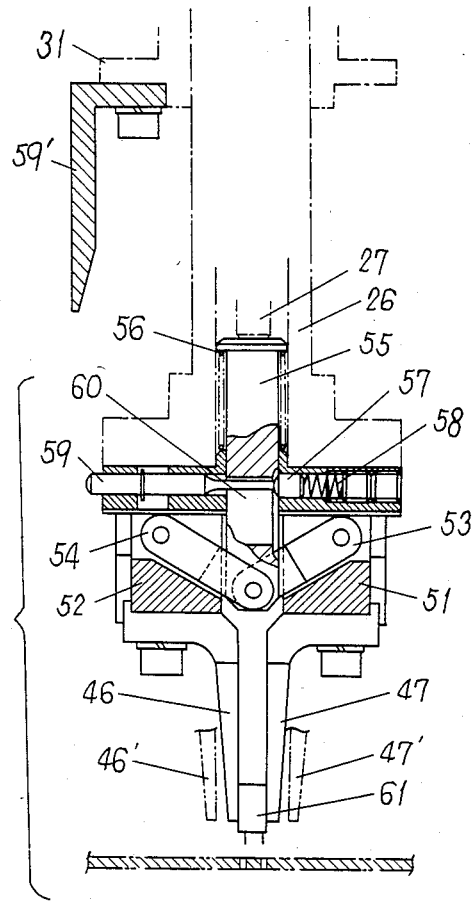
FIG. 11 is a section showing an embodiment of a part chucking device.
Figure 12:
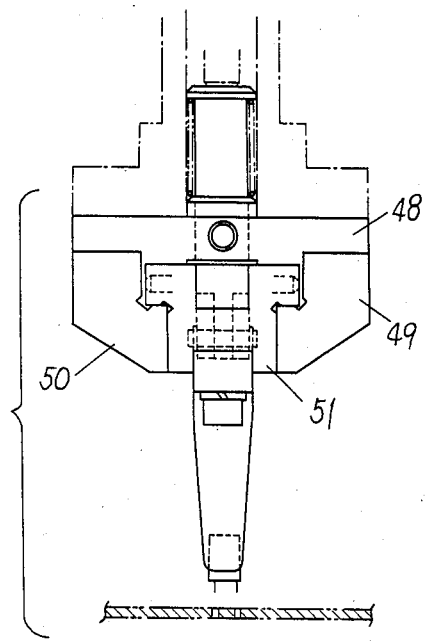
FIG. 12 is a side view of the same.

The part chucking device attached to the part mounting head 8 will now be described with reference to FIGS. 11 and 12.

Chuck pawls 46 and 47 are bolted to blocks 51 and 52 slidable relative to guide blocks 49 and 50 fixed to a base 48 fixed to the bottom of shaft 26. The blocks 51 and 52 are engaged with a shaft 55 by a pin through links 53 and 54.

The shaft 55 is vertically slidable relative to the base 48 and is constantly urged upwardly by a spring 56 to cause links 53, 54 to open the chuck pawls 46 and 47 into a condition shown at 46' and 47'. Further, a pin 57 contained in the base 48 is urged by a spring 58 toward the shaft 55. On the other hand, a pin 59 is slidably mounted in the opposite side of the base 48 and extends through an elongated opening 60 in the middle of the shaft 55 to the pin 57.

Thus, in operation, the shaft 55, in the opened state in which it is raised by the spring 56 (with the chuck pawls being at 46' and 47'), is moved to the part chucking position (B in FIG. 5), where the piston 27 of the part mounting head 8 is lowered by air pressure to cause the pawls to be moved by links 53, 54 and blocks 51, 53 to chuck an electric part 61.

Figure 13:
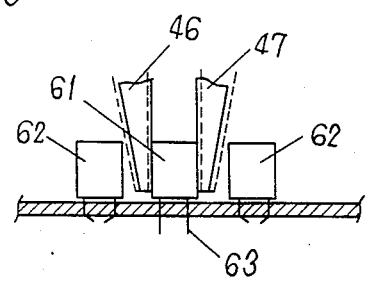
FIG. 13 is an explanatory view showing the abutting relation between a preceding mounted part and the chuck.

The part, as chucked, is raised by the piston and is also moved by the part insertion section 5 and lowered at a predetermined position where it is inserted into a printed circuit board. During the upward movement of the part chucking device, the piston 27 is raised and the chuck pawls 46 and 47 are opened by the spring 56 to leave the part behind in the circuit board. The pin 57 presses against the shaft 55 to moderate the degree of opening of the chuck to prevent the chuck from bending previously positioned electric parts 62, as shown in FIG. 13.

When the part chucking device is upwardly moved, the pin 59 strikes against a fixed guide 59' and is thereby pushed inwardly against the pin 57, thereby allowing the shaft 55 to rise completely under the force of the spring 56 and completely opening the chuck pawls to be ready for the next chucking operation. Since the part chucking device is fixed to the shaft 26 of the part mounting head 8 by two bolts, the attaching and detaching operation of the device is easy.

Figure 14:
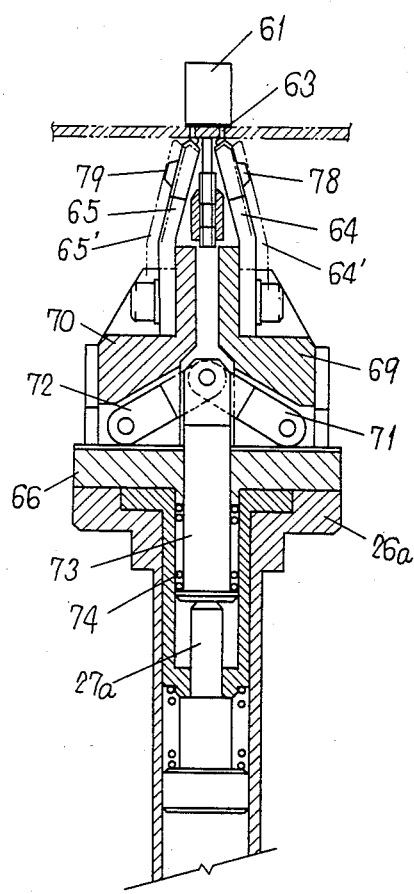
FIG. 14 is a section showing an embodiment of an anvil device.
Figure 15:
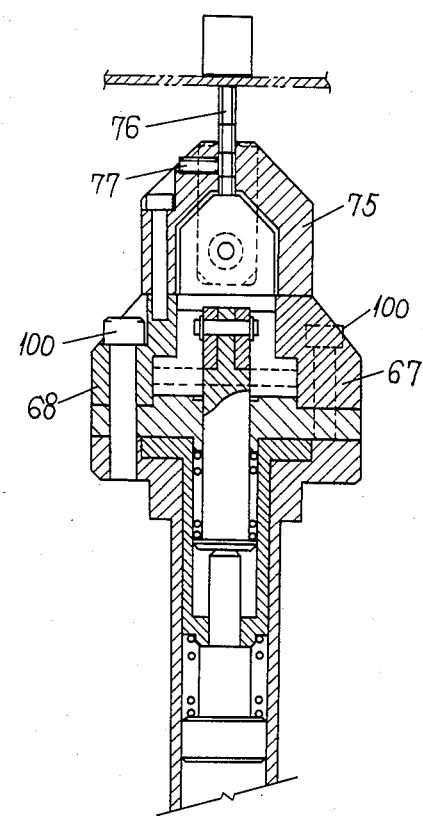
FIG. 15 is a side view, in section, of the same.

The anvil device for detecting and clinching the legs 63 of the electric part 61 will now be described with reference to FIGS. 14 and 15. Clinch pawls 64 and 65 are bolted to blocks 69 and 70 slidable relative to guide blocks 67 and 68 fixed to a base 66. The blocks 69 and 70 are engaged with a shaft 73 by a pin through links 71 and 72.

The shaft 73 is vertically slidable relative to the base 66 and is constantly downwardly urged by a spring 74 to open the clinch pawls 64 and 65 into a condition shown at 64' and 65'.

A bracket 75 is fixed to the guide blocks 67 and 68, and a printed circuit support 76 whose level is adjustable by threads is fixed to the bracket by a bolt 77.

The clinch pawls 64 and 65 have applied thereto strain gauges 78 and 79, respectively, for detecting the deflection of the pawls when they clinch the legs 63 of the electric part 61.

In operation, the anvil device is attached to the anvil head 10. Thus, as soon as the anvil head 10 rises to the back side of the printed circuit board, the electric part 61 is inserted into an insertion hole in the printed circuit board, and the legs 63 coming out of the back side are bent to a fixed angle by the clinch pawls 64 and 65 under the action of a piston 27a, similar to the operation of piston 27, whereby the electric part 61 is attached to the circuit board. In addition, since the anvil device, like the part chucking device, is fixed to a shaft 26a of the anvil head 10 by two bolts 100, exchange of the device is very easy.

The part supply section 1 will now be described with reference to FIGS. 5 and 16.

Parts 2 are prepared in advance and are received in magazines 3, as shown in FIG. 2(B).

The prepared magazines 3 are placed in a stock case 121 shown in FIGS. 5 and 16. Magazines containing parts which are the same in kind (shape, electrostatic capacity, etc.) are arranged vertically, while magazines containing different kinds of parts are arranged horizontally. The stock case 121 is inclined at a necessary angle to allow magazines 3 to fall by gravity.

Parts 2 are discharged by gravity from the lowermost magazine in the stock case 121, passing through a chute 122 to the position A shown in FIG. 5.

At the position A, there is a case 123 opened at one end to receive parts 2.

The case 123 is moved from the position A to the part supply position B by the operation of a cylinder 124. As soon as the case 123 leaves the position A, a holder 125 acts to hold a part located one unit short of the position A to prevent it from falling off the chute 122.

For a part 2 that comes to the part supply position B, the angle of inclination of the stock case 121 is corrected and positioned in a vertical state. The part at the part supply position B is taken up by the aforesaid chuck pawls 46 and 47, and as soon as the case 123 returns to the original position A, the holder 125 is opened to allow the case 123 to come in under its own weight.

When the parts in the lowermost magazine 3' are all discharged, this condition is detected (not shown) by the chute 122 and the magazine 3' is automatically discharged, with the second magazine moving to the lowermost position, and a new part is discharged onto the chute 122.

The discharge of the magazine 3' is selectively effected by the rotative action of discharge levers 126a and 126b, which are provided for each of the vertically arranged groups of magazines, caused by solenoids 128a and 128b, as shown in FIG. 16.

The magazine delivery mechanism will now be described in detail. The electric part 2 in the magazine 3' is detected by a part detector 127 installed at the inlet of the chute 122 and the following operation is performed. The numeral 108 denotes magazine guides arranged in pairs on both sides of the magazine 3' and adapted to be moved in a direction perpendicular to the plane of FIG. 16 by an unillustrated drive source. When the magazine guides 108 are moved from the condition of FIG. 16, the lowermost magazine 3' is transversely discharged through an opening in the magazine guide 108. The magazine 3 positioned immediately above the magazine 3' will not fall during discharge since its lower end is supported by rollers of the discharge levers 126a and 126b.

After a fixed time, the magazine guides 108 return to the original position and the support from the rollers is removed, so that the next magazine falls to become a magazine 3'.

INDUSTRIAL APPLICABILITY

Since the present invention is based on a method whereby different parts supplied to a predetermined position are randomly mounted on a printed circuit board at predetermined positions by the same part mounting head, the invention is suitable for mounting a relatively small number of parts and the cost of installation is low. It has superior features including an arrangement wherein several units are connected in a line, combined with manual insertion, and coupling to exclusive-purpose machines (axial insertion machine, radial insertion machine, etc.), which contribute a great deal to improved productivity.

Further, since magazines can be supplied even during operation without stopping the apparatus, the invention is very valuable as an apparatus for supplying parts, particularly small-sized parts.

Further, the invention uses a frame construction enabling a single head to perform three functions in a very compact manner, whereby it can be used in a small space for the operation of mounting small parts and can be easily attached to a transfer device. Further, because of the use of a shaft construction for a pair of vertical movements on the part mounting head side, the construction is simplified and reduction of weight is attained. Thus, the industrial value of the invention is very high.

We claim:

1. In an apparatus for mounting electric parts on a circuit board and of the type including a part supply section fixed to a base for supplying electric parts successively to a part supply position, a printed circuit board transfer section for supporting and transferring a printed circuit board, and a part mounting section for transferring parts between said part supply position and the printed circuit board, the improvement wherein:

said part mounting section is positioned at a side of said printed circuit board transfer section opposite to a side thereof whereat said part supply section is positioned; and said part mounting section comprises a frame slidably mounted on a pair of horizontal guide shafts extending parallel to the printed circuit board transfer direction of said printed circuit board transfer section, upper and lower guide shafts respectively disposed at upper and lower portions of said frame so that they are slidable with said frame along said horizontal guide shafts and extend at right angles to said horizontal guide shafts with said horizontal guide shafts positioned between said upper and lower guide shafts, a connecting frame connecting said upper and lower guide shafts, a part mounting head mounted on said upper guide shaft, an anvil head mounted on said lower guide shaft, with said printed circuit board transfer section being positioned between said heads, a first motor for moving said frame along said horizontal guide shafts, and a second motor for moving said upper and lower guide shafts along said frame, said part mounting head comprising a chuck device for grasping electric parts, a shaft supporting said chuck device in a vertically movable and rotatable manner, a means to move said shaft vertically by compressed air, a means to rotate said shaft by compressed air, and a stop means to stop said shaft at a desired rotational position.

2. The improvement claimed in claim 1, wherein said part supply section comprises magazines adapted to be filled beforehand with electric parts to be supplied, a stock case holding said magazines in several rows, said stock case being inclined at an angle enabling said magazines to fall under their own weight, discharge lever means for, when the parts in the lowermost said magazine have been discharged, removing such magazine, an inclined chute extending continuously from a part outlet of said stock case, and a case for separating one by one the parts in a front end of said chute.

3. The improvement claimed in claim 1, wherein said means to rotate said shaft comprises a cylinder tube rotatable with said shaft and a valve member on said cylinder tube and rotatable by compressed air, thus rotating said cylinder tube and said shaft.

4. The improvement claimed in claim 3, wherein each said chuck device comprises two opposed chuck pawls capable of holding an electric part therebetween, a slide shaft vertically movable within said shaft, and links connected to said slide shaft and to said chuck pawls for opening and closing said chuck pawls upon vertical movement of said slide shaft.

5. The improvement claimed in claim 4, further comprising an opening in a peripheral portion of said slide shaft, a hole communicating with said opening and extending through said slide shaft radially thereof, a first pin engageable with said opening and constantly urged to contact said slide shaft, and a second pin slidably mounted in said hole and so arranged that it abuts against a fixed guide and thereby moved in said hole to abut against said first pin to thereby drive said first pin out of said opening.

* * * * *